United States Patent
Sirringhaus et al.

(10) Patent No.: US 6,723,394 B1
(45) Date of Patent: Apr. 20, 2004

(54) ALIGNED POLYMERS FOR AN ORGANIC TFT

(75) Inventors: Henning Sirringhaus, Cambridge (GB); Richard Henry Friend, Cambridge (GB); Richard John Wilson, Dorset (GB)

(73) Assignee: Cambridge University Technical Services Limited, Cambridge (GB)

( * ) Notice: Subject to any disclaimer, the term of this patent is extended or adjusted under 35 U.S.C. 154(b) by 0 days.

(21) Appl. No.: 10/018,425

(22) PCT Filed: Jun. 21, 2000

(86) PCT No.: PCT/GB00/02404

§ 371 (c)(1),
(2), (4) Date: Apr. 16, 2002

(87) PCT Pub. No.: WO00/79617

PCT Pub. Date: Dec. 28, 2000

(30) Foreign Application Priority Data

Jun. 21, 1999 (GB) .............................................. 9914489
Dec. 1, 1999 (GB) ............................................. 9928435

(51) Int. Cl.$^7$ .............................................. C09K 13/00
(52) U.S. Cl. ...................... 428/1.1; 428/1.2; 428/411.1; 428/421; 313/438; 313/500; 313/502; 313/503; 313/504; 313/505; 313/506; 257/40; 257/290; 438/82
(58) Field of Search .................... 428/1.1, 1.2, 411.1, 428/421; 313/505, 438, 500, 502, 503, 504, 506; 257/40, 290; 438/82

(56) References Cited

U.S. PATENT DOCUMENTS

| | | | |
|---|---|---|---|
| 6,403,809 B1 * | 6/2002 | Holmes et al. | ............... 549/41 |
| 6,528,940 B1 * | 3/2003 | Okada et al. | ............... 313/505 |
| 6,603,139 B1 * | 8/2003 | Tessler et al. | ................ 257/40 |
| 6,608,323 B2 * | 8/2003 | Marks et al. | ................. 257/40 |

FOREIGN PATENT DOCUMENTS

EP        0786820        *  7/1987

OTHER PUBLICATIONS

Redecker et al. "Mobility . . . Polyfluorene" Appl. Physics Lett. NY vol 74, No. 10, 1400–1402, Mar. 1999.*

Grell et al. "Blue Polarized . . . Polyfluorene", Advanced Materials vol 11, No. 8, 6–98, 671–675, Jun. 1999.*

Sirringhaus et al, "Integrated . . . Diodes", Synthetic Metals vol. 101, 5–93, 557–560, May 1999.*

Brown et al. "Electro–Optical . . . Active Layers" Synthetic Metals vol 101, May 1999, 557–560.*

* cited by examiner

Primary Examiner—Leszek Kiliman

(57) ABSTRACT

A method for forming an electronic device having a semi-conducting active layer comprising a polymer, the method comprising aligning the chains of the polymer parallel to each other by bringing the polymer into a liquid-crystalline phase.

49 Claims, 8 Drawing Sheets (a)

(b)

(c)

ALIGNED POLYMERS FOR AN ORGANIC TFT

This invention relates to aligned polymers, especially aligned polymers suitable for use in devices such as polymer thin film transistors, and methods of aligning polymers. The aligned polymers are preferably substantially parallel aligned, liquid-crystalline conjugated polymers.

Semiconducting conjugated polymer field-effect transistors (FETs) have potential applications as key elements of integrated logic circuits (C. Drury, et al., APL 73, 108 (1998)) and optoelectronic devices (H. Sirringhaus, et al., Science 280, 1741 (1998)) based on solution processing on flexible plastic substrates. One main criterion to obtain high charge carrier mobilities has been found to be a high degree of structural order in the active semiconducting polymer.

For some polymers it is known to be possible to induce uniaxial alignment of the polymer chains in thin films by using processing techniques such as Langmuir-Blodgett (LB) deposition (R. Silerova, Chem. Mater. 10, 2284 (1998)), stretch alignment (D. Bradley, J. Phys. D 20, 1389 (1987)), or rubbing of the conjugated polymer film (M. Hamaguchi, et al., Appl. Phys. Lett. 67, 3381 (1995)). Polymer FET devices have been fabricated with uniaxially aligned polymer films fabricated by stretch alignment ((P. Dyreklev, et al., Solid State Communications 82, 317 (1992)) and LB deposition (J. Paloheimo, et al., Thin Solid Films 210/211, 283 (1992)). However, the field-effect mobilities in these studies have been low ($<10^{-5}$ cm$^2$/Vs).

Local order in thin polymer films can be achieved by making use of the tendency of some polymers to self-organise. An example is poly-3-hexylthiophene (P3HT) in which lamella-type ordered structures can be formed by phase segregation of rigid main chains and flexible side chains. By using suitable deposition techniques and chemical modification of the substrate it is possible to induce preferential orientations of the ordered domains of the polymer with respect to the substrate surface. At present P3HT yields the highest known field-effect mobilities of 0.05–0.1 cm$^2$/Vs for polymer FETs (H. Sirringhaus, et al., Science 280, 1741 (1998)). In these known devices there is no preferential, uniaxial alignment of the polymer chains in the plane of the film.

Some conjugated polymers and small molecules exhibit liquid-crystalline (LC) phases. By definition, a liquid-crystalline phase is a state of matter, in which the molecules have a preferential orientation in space. This alignment is conventionally regarded as being alignment with respect to a vector called the director. Unlike in the solid, crystalline state the positions of the molecules in the LC phase are randomly distributed in at least one direction. Depending on the type of orientational and residual positional order one distinguishes between nematic, cholesteric and smectic LC phases. The nematic phase possesses long-range orientational order but no positional order. Smectic phases are characterized by a two-dimensional (2D) layered structure, in which the molecules self-assemble into a stack of layers each with a uniform orientation of the molecules with respect to the layer normal, but either no positional order or a reduced degree of positional order in the 2D layers. LC phases occur mainly in polymers/molecules with a significant shape anisotropy. Examples of conjugated LC polymers are main-chain polymers with a rigid-rod conjugated backbone and short flexible side chains, so-called hairy-rod or rigid-rod polymers. Examples are poly-alkyl-fluorenes (M. Grell, et al., Adv. Mat. 9, 798 (1998)) or ladder-type poly-paraphenylenes (U. Scherf, et al., Makromol. Chem., Rapid. Commun. 12, 489 (1991)). Another type of LC polymers are side-chain polymers with a flexible non-conjugated backbone and rigid conjugated units in the side chains.

A special class of liquid-rystalline organic molecules are disc-shaped molecules with a rigid 2D conjugated core and flexible side chains such as hexabenzocoronenes (HBC) (P. Herwig, et al., Adv. Mater. 8, 510 (1996)) or triphenylenes (D. Adam, et al. Nature 371, 141 (1994)). They tend to form so-called discotic mesophases in which 1-dimensional columns are formed by $\pi$—$\pi$ stacking of the disc-shaped conjugated cores (FIG. 8).

LC phases typically occur at elevated temperatures in the undiluted organic material (thermotropic phases) or if the organic material is dissolved in a solvent at a sufficiently high concentration (lyotropic phases) (see, for example, A. M. Donald, A. H. Windle, Liquid Crystalline Polymers, Cambridge Solid State Science Series, ed. R. W. Cahn, E. A. Davis, I. M. Ward, Cambridge University Press, Cambridge, UK (1992)).

LC polymers can be uniaxially aligned by suitable processing techniques. In an aligned sample the orientation of the director, that is, for example, the preferential orientation of the polymer chains in a main-chain LC polymer, is uniform over a macroscopic distance of >$\mu$m–mm. This is the scale of practical channel lengths in FET devices. Alignment can be induced by shear forces or flow or by depositing the LC polymer onto a substrate with an alignment layer exhibiting a uniaxial anisotropy in the plane of the substrate. The alignment layer may be a mechanically rubbed organic layer such as polyimide (M. Grell, et al., Adv. Mat. 9, 798 (1998)), a layer evaporated at an oblique angle onto the substrate, or a layer with a grooved surface. For a review of the various techniques which can be used to align LC molecules see for example, J. Cognard, J. Molec. Cryst. Liq. Cryst. Suppl. Ser. 1, 1 (1982).

A particularly attractive technique is photoalignment which is less prone to mechanical damage than rubbing. A photosensitive polymer is polymerized by exposure with linearly polarized light. The plane of polarization of the light defines a preferential orientation of the chains of the photosensitive polymer. Such layers can be used as alignment layers for a broad range of polymer and small molecule liquid crystals (M. Schadt, et al., Nature 381, 212 (1996)).

Uniaxially aligned liquid-crystalline polymers have been incorporated as active light-emissive layers into polymer light emitting diodes to produce linearly polarized light (M. Grell, et al., Adv. Mat. 9, 798 (1998); G. Lussem, et al., Liquid Crystals 21, 903 (1996)).

EP 0786 820 A2 discloses the device structure of an organic thin film transistor in which the organic semiconducting layer is in contact with an orientation film, such as a rubbed polyimide layer. The orientation film is intended to induce alignment of the organic semiconducting layer when the latter is deposited on top of the orientation film. However, for most organic semiconducting materials, in particular for conjugated polymers processed from solution, mere deposition onto an orientation film is not sufficient to induce alignment in the organic semiconductor.

WO99/10929 and WO99/10939 disclose a method of forming a polymer field-effect transistor involving building up a cross-linked layer structure and a method of forming an interconnect in such a structure. Each layer is converted into an insoluble form prior to solution deposition of the next layer.

According to one aspect of the present invention there is provided a method for forming an electronic device having a semiconducting active layer comprising a polymer, the method comprising aligning the chains of the polymer parallel to each other by bringing the polymer into a liquid-crystalline phase. This aspect of the invention also provides an electronic device formed by such a method.

According to a second aspect of the present invention there is provided an electronic device having a semiconducting active layer in which the polymer chains have been aligned parallel to each other by bringing the polymer into a liquid-crystalline phase. Preferably the chains are aligned parallel to each other.

The alignment of the chains may suitably be referred to as uniaxial alignment since at least within a localised domain of orientation, and more preferably over a wider extent, the parallel alignment of the polymer chains indicates a single axis of alignment.

The electronic device is suitably a switching device. The electronic device is preferably a transistor, most preferably a thin-film transistor. The device may thus be a polymer transistor.

The said liquid-crystalline phase may be a nematic phase or a smectic phase.

The step of bringing the polymer into the liquid-crystalline phase suitably comprises heating the polymer. There is preferably a subsequent step of cooling the polymer to fix its structure. That cooling is preferably sufficiently rapid that the polymer retains the said alignment in a preferred uniaxial direction after the cooling. The cooling may be sufficiently rapid that the polymer is in an amorphous, glassy state after the cooling. The cooling may involve quenching the polymer. The cooling is preferably from above the glass transition temperature of the polymer. The cooling is conveniently to ambient temperature, for example room temperature (20° C.).

The said method may comprise forming source and drain electrodes of the transistor in locations relative to the active layer such that the channel of the transistor is oriented parallel to the alignment direction of the polymer chains. Accordingly, the said device may have a channel that is oriented parallel to the alignment direction of the polymer chains.

The method preferably comprises depositing the polymer on top of an alignment layer capable of inducing the said alignment of the polymer. The method preferably comprises the step of forming the alignment layer, for example by mechanical rubbing of a substrate.

Preferably the parallel alignment of the polymer chains extends over a distance/domain size of at least 100 nm and more preferably at least 1 µm, most preferably at least 10 µm.

It is preferred that the polymer chains have monodomain, uniaxial alignment over the area of the electronic device. However, performance improvements may already be obtained if the alignment occurs only locally, that is, if the polymer is in a multidomain configuration with several domains with randomly oriented directors located within the active area of the device. In each domain the polymer chains would be aligned uniaxially parallel to the director, when brought into the LC phase. To produce films in a multilayer configuration no alignment layer is needed.

The polymer may be a semiconducting polymer. The polymer may be a rigid-rod liquid-crystalline polymer. The polymer may be a conjugated polymer. The polymer may be a polyfluorene polymer, for example a polyfluorene homopolymer or a polyfluorene based block copolymer. The polymer may, for example be F8 or F8T2.

The semiconducting polymer may suitably be deposited from solution. It is preferred that it is soluble in a non-polar organic solvent, but is insoluble in a polar solvent.

The method may also comprise the step of forming an active interface of the transistor by solution deposition of a second polymer layer. That second polymer layer may be deposited on top of a solution-processed polymer layer that has not been converted into an insoluble form prior to the deposition of the second polymer layer. The solution-processed layer may be the aforesaid aligned layer and/or semiconductor active layer.

The second layer may provide a gate insulator of the transistor. The second layer may be deposited from a polar organic solvent in which the said solution-processed polymer layer is not soluble. The solution deposition of the second polymer layer is preferably performed after the said alignment step. The second layer may be soluble in an alcohol solvent, such as isopropanol or butanol. It may comprise polyvinylphenol (PVP).

An aspect of the present invention also provides a logic circuit comprising a transistor as set out above. Such a logic circuit may also include at least one optical device. An aspect of the present invention also provides an active matrix display comprising a transistor as set out above, for example as part of voltage hold circuitry of a pixel of the display.

According to a further aspect of the present invention there is provided a method for forming an electronic device (for example a transistor) comprising the step of forming an active interface of the device by solution deposition of a polymer layer directly on top of a solution-processed polymer layer that has not been converted into an insoluble form prior to the deposition of the second polymer layer.

According to a further aspect of the invention there is provided a method for forming an electronic device having a semiconducting active layer comprising a polymer, the method comprising inducing parallel alignment in the chains of the polymer by bringing the polymer into a liquid-crystalline phase.

According to a further aspect of the invention there is provided a method for forming an electronic device having a semiconducting active layer comprising a polymer, the method comprising the step of bringing the polymer into a liquid-crystalline phase.

According to a further aspect of the invention there is provided a method for forming an electronic device having a semiconducting active layer comprising a polymer, the method comprising aligning the chains of the polymer within domains by bringing the polymer into a liquid-crystalline phase.

A method for forming an electronic device having a semiconducting active layer comprising a polymer, the method comprising aligning the chains of the polymer as a monodomain oriented in a preferred uniaxial direction within the layer of the electronic device by bringing it into a liquid-crystalline phase.

Preferred aspects of the said further aspects of the invention include analogously all those set out above in relation to the other aspects of the invention.

The present invention will now be described by way of example with reference to the accompanying drawings, in which.

The present method provides a means of forming uniaxially aligned polymers suitable for use, for example, as an active semiconductor layer in an electronic device such as a transistor—especially a polymer thin film transistor (TFT). The method involves alignment of the polymer by means of a liquid crystal phase.

Figure 1:
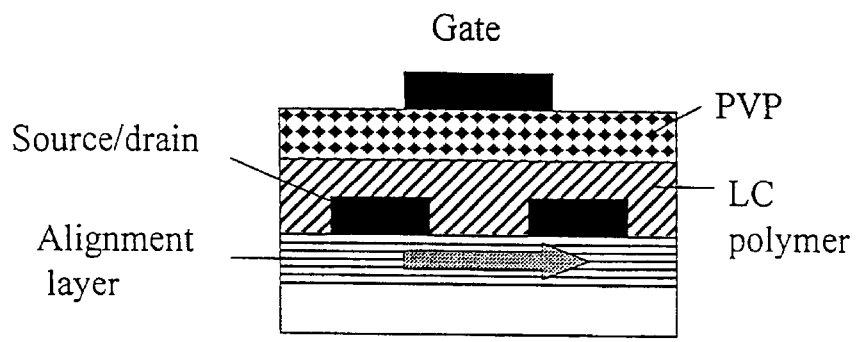
FIG. 1 is a schematic diagram of the top-gate device configuration for LC polymer TFTs and orientation of the devices on the substrate with respect to the rubbing direction.
Figure 1:
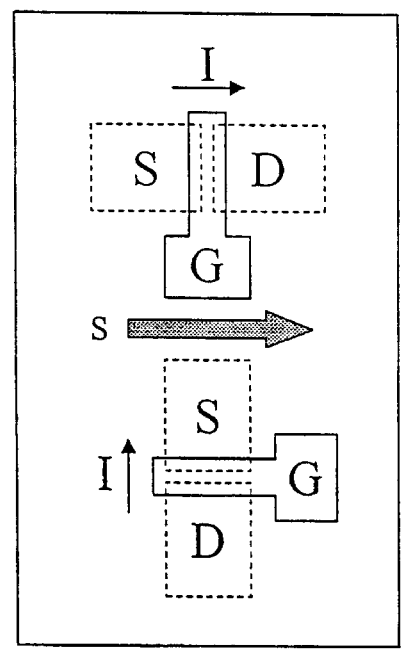

In a device such as a TFT formed with such polymer as the active layer, current flow is suitably either preferentially along the polymer chains or preferentially normal to the polymer chains (FIG. 1). This can allow useful uniformity of charge transport properties in the relevant direction.

The method is described below with specific reference to polyfluorene-based homopolymers such as poly-9,9-dioctylfluorene (F8) and block-copolymers such as poly(9, 9-dioctylfluorene-co-dithiophene) (F8T2). These main-chain LC polymers exhibit nematic LC phases above 160° C. (F8), and 265° C. (F8T2), respectively. However, the method is not limited to these materials or materials of those types, and is applicable to a wide range of rigid-rod and LC polymers.

In one important preferred step of the method a polymeric gate insulator may be deposited by solution-deposition on top of the aligned semiconductive polymer forming an abrupt active interface between the semiconductor and the insulator.

The fabrication of an aligned polymer FET having a top-gate thin film transistor (TFT) configuration will now be described. (See FIG. 1). Other devices and devices of other formations may alternatively be made. In a first step a thin (500Å) polyimide precursor film (Merck ZLI 2630 Polyimide kit) is spin-coated onto a glass substrate (7059 glass, Corning) and converted to polyimide by heating at 65° C. for 15 min and 300° C. for 1 h. This polyimide precursor was selected for its high thermal stability and glass transition temperature providing good alignment capability at elevated temperature. Other materials may be used. Then the polyimide film is rubbed mechanically with a nylon cloth mounted on a mechanical drum to allow it to act as an alignment layer as will be described below. A suitable procedure for forming such an alignment layer is described in M. Grell, et al., Adv. Mat. 9, 798 (1998). Care is preferably taken to minimize the particle contamination during the rubbing process as particles are believed to be primarily responsible for device failure and gate leakage in finished devices Other techniques to fabricate the alignment layer could be used as well instead of the above technique. A particularly attractive technique is photoalignment, as it does not involve any mechanical treatments of the alignment layer that may cause mechanical damage to the film and reduce the yield of devices (M. Schadt, et al., Nature 381, 212 (1996).

Gold source-drain electrodes are then defined on the polyimide/glass substrate either by evaporation through a shadow mask or by conventional photolithography. For the photolithographic patterning of the gold electrodes lift-off techniques are preferred. Direct etching of the gold film has been found to adversely affect the alignment capability of the underlying polyimide presumably by modification of the polyimide surface when exposed to the etching solution (aqua regia). With lift-off-techniques in which the surface of the polyimide is only exposed to the acetone solvent with which the photoresist and the gold film is lifted-off, the alignment of the LC polymers between the source and drain electrodes (FIG. 3) was as high as on plain substrates without source-drain electrodes.

Other deposition and patterning of the electrodes such as direct ink-jet printing of a conducting polymer such as polyethylenedioxythiophene doped with polystyrene sulfonate (PEDOT/PSS) may be used. On the same substrates devices are defined in which the TFT channel is either parallel or perpendicular to the rubbing direction.

As the next step the LC semiconducting polyfluorene polymer is deposited by spin-coating from a 1 weight % solution in mixed xylenes. The thickness of the polymer film is on the order of 150–1000 Å. Thin polymer films are preferred to minimize contact resistance effects caused by transport of charge carriers through the bulk of the semiconducting film from the source-drain contacts to the active interface. The polymer film is then heated into its LC phase at 200° C. for 24–48 h (F8) and 280° C. for 1–15 minutes (F8T2), respectively. During the annealing the polymer aligns on the surface of the rubbed polyimide surface. The films are then brought into a glassy state by rapid quenching to room temperature. The quenching is performed by quickly moving the substrates from the hot stage onto a metallic surface at room temperature. The quenching step is thought to preserve the uniaxial alignment of the LC phase and to suppress crystallization and formation of grain boundaries that would form if the films were cooled slowly through the phase transition between the LC and the crystalline phase. Crystalline grain boundaries may act as charge carrier traps and adversely affect the transistor performance. During the annealing step care is taken not to contaminate the surface of the polymer film, by performing the annealing steps either in vacuum or under inert atmosphere.

To further enhance the structural order in the polymer film and the degree of uniaxial alignment additional annealing steps at lower temperatures may be performed. The sample may also be kept in a saturated solvent atmosphere at elevated temperatures after the alignment.

Figure 2:
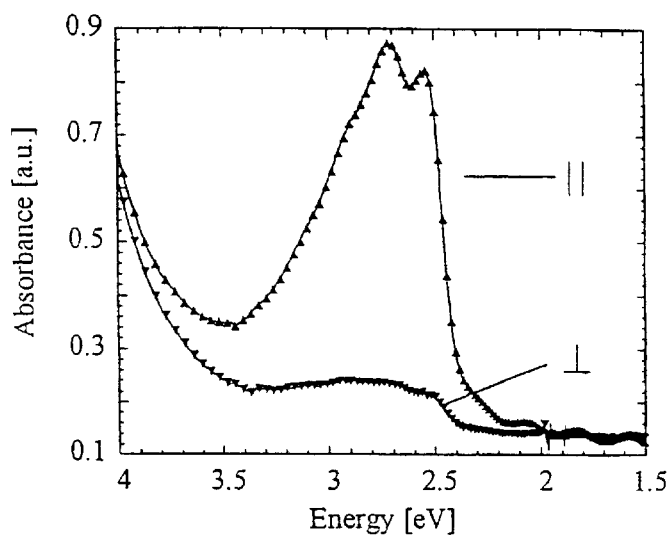
FIG. 2 shows the polarized optical absorption spectra of a uniaxially aligned T2/PVP TFT measured in the metal-free regions with polarization of the light parallel and normal to the rubbing direction.

FIG. 2 shows optical absorption spectra measured in the metal-free regions of the completed TFT substrate. The absorption between 2.5–3 eV belongs to the T2 polymer. The absorption is stronger for light polarized parallel to the rubbing direction than for light polarized perpendicular to it. Since this optical transition is polarized along the polymer chain we conclude that the polymer chains are aligned parallel to the rubbing direction. The dichroic ratio estimated from the absorption spectra is ≈9.6, which is a measure of the high degree of uniaxial alignment of the polymer film.

Figure 3:
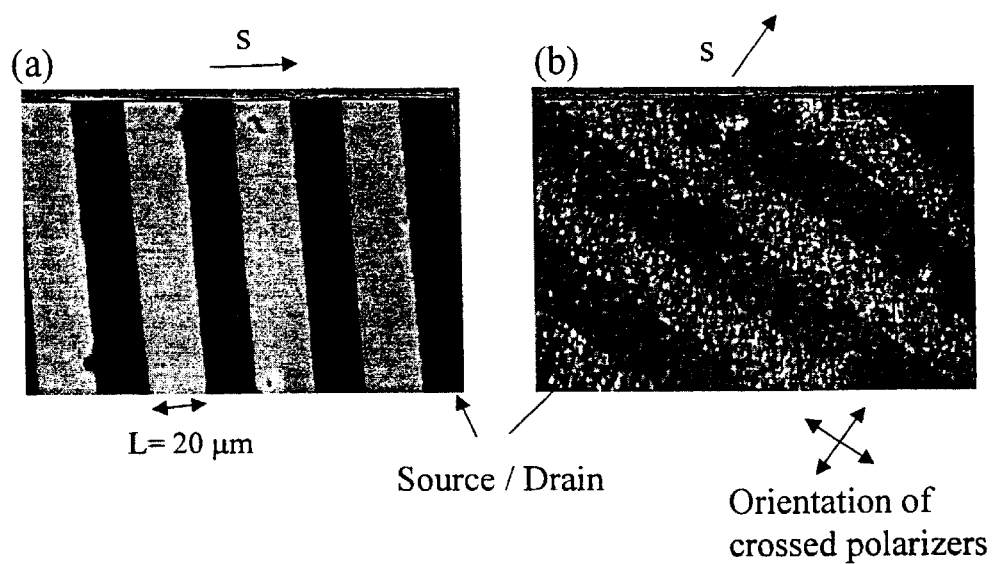
FIG. 3 shows an optical micrograph of an aligned T2/PVP TFT viewed under crossed polarizers. The source and drain electrodes were defined by photolithography (Channel length L=20 µm)

FIG. 3 shows an optical micrograph of the channel region of a completed TFT device with a uniaxially aligned T2 layer. The image is viewed in reflection mode through the glass substrate. Under crossed polarizers the interdigitated gold source-drain electrodes appear dark. If the polarizers make a 45° angle with the rubbing direction s (parallel to the channel length L) the plane of polarization of the incident light is rotated when passing through the uniaxially aligned polymer film and some of the reflected light can pass through the second polarizer. As a consequence the film appears bright in between the dark source drain electrodes (FIG. 3a). However, if one of the crossed polarizers is oriented along the rubbing direction no rotation of the polarization of the incident light can occur and the channel region appears dark as well (FIG. 3b). In FIG. 3b the intensity of the incident light has been enhanced relative to FIG. 3a to make the contrast between the Au fingers and the channel region visible. These observations clearly show that the polymer chains are aligned uniaxially in the channel of the TFTs.

After the processing and annealing steps of the alignment of the active semiconducting polymer the TFT devices are completed by solution-deposition of a gate insulating layer and a metallic gate electrode on top. In order to allow the fabrication of the transistor channel on the top surface of the aligned LC polymer film some critical problems had to be solved. For the formation of a device having optimal electrical properties it is greatly preferred (a) that the underlying layers are not dissolved nor swelled by the solvents used for the deposition of the gate insulator and (b) that at the same time the wetting properties of the solutions on the underlying layers allow the deposition of smooth and continuous insulating films.

It should be emphasized that preferred feature (a) is particularly critical since the current flow in a TFT is confined to a typically 10 nm thick interfacial layer at the interface between the active semiconductor and the gate insulator, where the accumulation layer is formed. The performance of the TFT is determined by the structural and electronic properties of this interfacial layer, whereas the properties of the bulk of the semiconductor layer are of secondary importance only. The performance of the TFT is very sensitive to the structural properties and abruptness of the active interface. Any intermixing between the semiconductor and the insulator during the solution deposition will result in high interfacial roughness and degradation of the electronic properties of the accumulation layer.

Preferred feature (b) implies that the gate-insulating layer needs to be smooth and continuous without pinholes and have a high dielectric strength in order to allow the application of a high electric field to form the accumulation layer.

Figure 4:
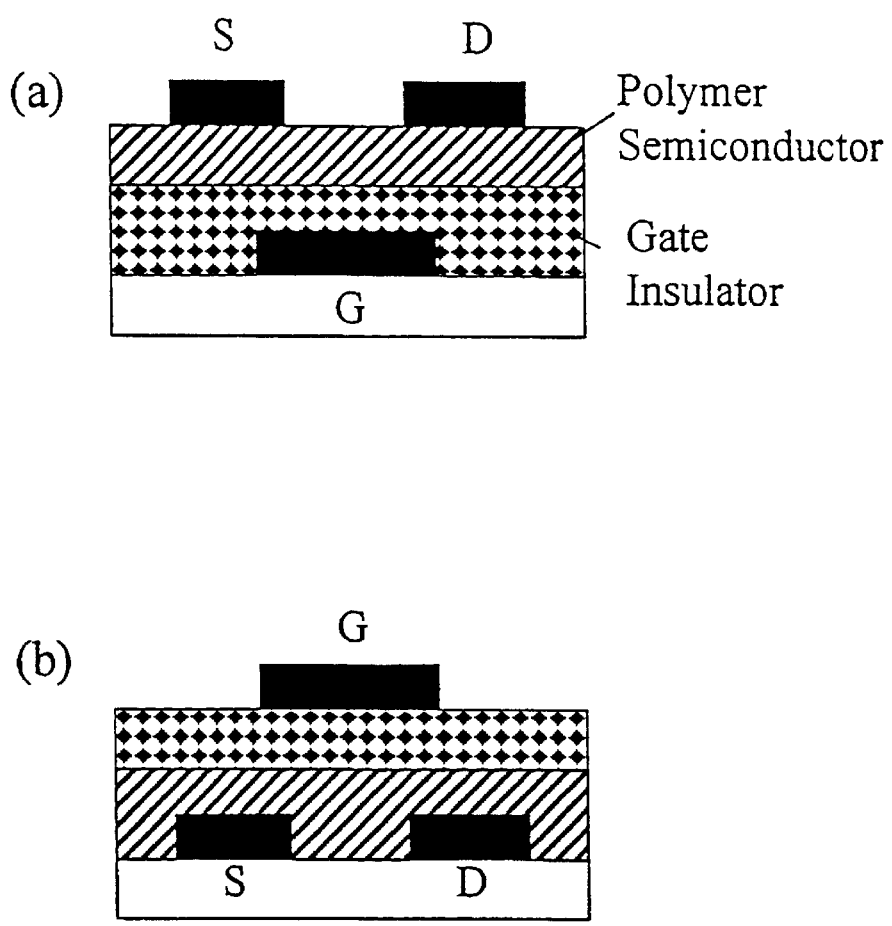
FIG. 4 shows a schematic diagram of bottom (a) and top-gate (b) TFT configurations.

The above mentioned preferred features (a) and (b) are not only relevant for fabricating liquid-crystalline polymer TFTs, as demonstrated here, but apply in general to solution processed, all-polymer TFTs with top-gate structure (FIG. 4b), and analogously to devices with the more conventional bottom-gate structure (FIG. 4a).

Previous approaches to fabricate all-polymer TFTs have used precursor routes. A soluble precursor material is solution-deposited as a first layer, and then converted into the final polymer that is not soluble in common organic solvents. The conversion may involve the elimination of solubilizing side groups, an intrachain chemical reaction to form a more rigid polymer backbone or a cross-linking reaction. The conversion usually involves a heat treatment and/or exposure to a chemical reagent. To fabricate bottom-gate all-polymer TFTs precursor-route insulating layers (FIG. 4a) such as polyimide (Z. Bao, et al., Chem. Mat. 9, 1299 (1997)) have been used. For top-gate devices precursor-route poly-thienylene-vinylene (PTV) as the active semiconductor has been used (C. Drury, et al., APL 73, 108 (1998)). However, the use of precursor routes severely limits the choice of semiconducting and insulating polymers. For many polymers such as high-mobility poly-3-hexylthiophenes (P3HT) no suitable precursor routes are known. To the best of our knowledge all-polymer top-gate FETs with a soluble polymer as the active semiconductor have not been fabricated. It is non-obvious and has not been demonstrated yet that a sufficiently abrupt interface can be formed by solution-deposition techniques.

Here we demonstrate a method by which high-mobility all-polymer top-gate TFTs can be fabricated with solution-processible polymers by making use of the different solubility of the semiconducting and insulating polymers in polar and non-polar solvents. We use non-polar semiconducting conjugated polymers such as P3HT, F8, F8T2 or poly(9,9'-dioctyl-fluorene-co-N-(4-butylphenyl) diphenylamine) (TFB) that have a low solubility in polar solvents such as dimethylformamide (DMF), Propylene-glycol-methyl-ether-acetate (pygmea), water or alcohols. We use insulating polymers such as poly-hydroxystyrene (also called poly-vinylphenol (PVP)), poly-vinyl-alcohol (PVA) polymethylmethacrylate (PMMA) or polyisobutyl-methyl-methacrylate (PiBuMA) which can be dissolved in polar solvents. PVP has been used previously to fabricate all-polymer top-gate TFTs in combination with an insoluble semiconducting polymer (PTV) fabricated by a precursor route (C. Drury, et al., APL 73, 108 (1998)).

The particular solvent/insulating polymer combination is chosen according to the polarity of the solvent and the wetting properties of the solution on the surface of the underlying semiconducting polymer. Alcohols such as methanol, ethanol, butanol, or isopropanol have been found to be particularly suitable. Most non-polar semiconducting polymers have exceptionally low solubility in alcohols. This is partly because of the highly polar nature of the hydroxyl groups of the alcohol, partly because of hydrogen bonding among the alcohol molecules in solution. This further lowers the solubility of those hydrophobic polymers that cannot take part in hydrogen bonding. Solutions of insulating polymers such as PVP in alcohols also tend to exhibit a relatively high viscosity. This is believed to be partly due to the hydrogen bonding between alcohol solvent molecules and the hydroxyl groups of the PVP polymer in solution. A moderately high viscosity facilitates the deposition of continuous smooth films helping to overcome the wetting problems of a polar solution on a non-polar substrate. Alcohols with different boiling points can be used. Films fabricated from high boiling point alcohols such as butanol tend to have smoother film morphology than those prepared from low boiling alcohols such as isopropanol or methanol. However, no significant differences of TFT mobility were observed for devices fabricated with the same gate insulating polymer deposited from different alcohol solvents. This indicates that the integrity and abruptness of the active interface is well preserved with alcohol solvents.

Other polar solvents such as Poly-propylene-glycol-ether-acetate (pygmea) have been used successfully as well. Although the devices functioned reasonably well, the TFT mobility was typically a factor of 2 lower than with alcohol solvents. This is attributed to some small residual solubility of the polyfluorene polymer in the polar pygmea solvent. To test this hypothesis F8T2 films were immersed in pygmea for several minutes. Small changes of the optical absorption spectrum of the film were observed afterwards, indicating that the solvent interacted with the surface of the F8T2 film (either by dissolution or swelling). No such changes were observed in the case of alcohol solvents.

With PVP gate insulators deposited from alcohol solutions TFTs were fabricated with a performance comparable to that of control devices fabricated on standard $SiO_2$/Si FET substrates. Before deposition of the PVP the substrate is coated by the same alcohol solvent that is used for the PVP solution and spun-dried. This step is intended to wash off any alcohol-soluble residual components of the polymer film. The PVP gate insulator is then spin-coated from a 5–10 weight % solution, preferably in an alcohol such as isopropanol or butanol. The capacitance of 1.2 $\mu$m thick PVP films are on the order of 3–5 $nF/cm^2$ as measured by impedance spectroscopy on metal-insulator-semiconductor (MIS) diodes, and plain capacitor structures. Thinner PVP gate insulators with thicknesses of 200–500 nm are preferred and have been fabricated as well. The devices are completed by deposition of a gold top-gate electrode through a shadow mask.

The source-drain and gate electrodes of the TFT may also be fabricated from a conducting polymer that is patterned by a suitable technique such as ink-jet printing, soft-lithographic patterning or screen printing.

Figure 5:
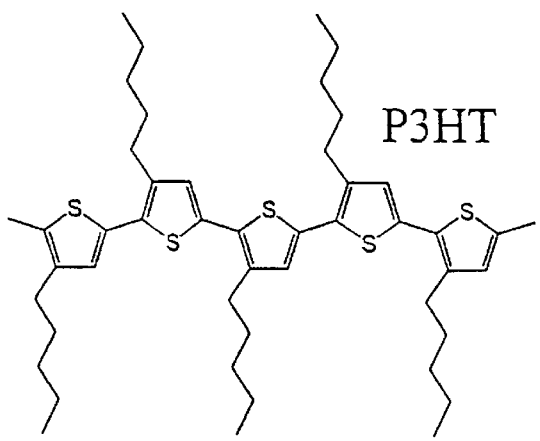
FIG. 5 shows output characteristics of a top-gate P3HT/PVP TFT on a glass substrate.
Figure 5:
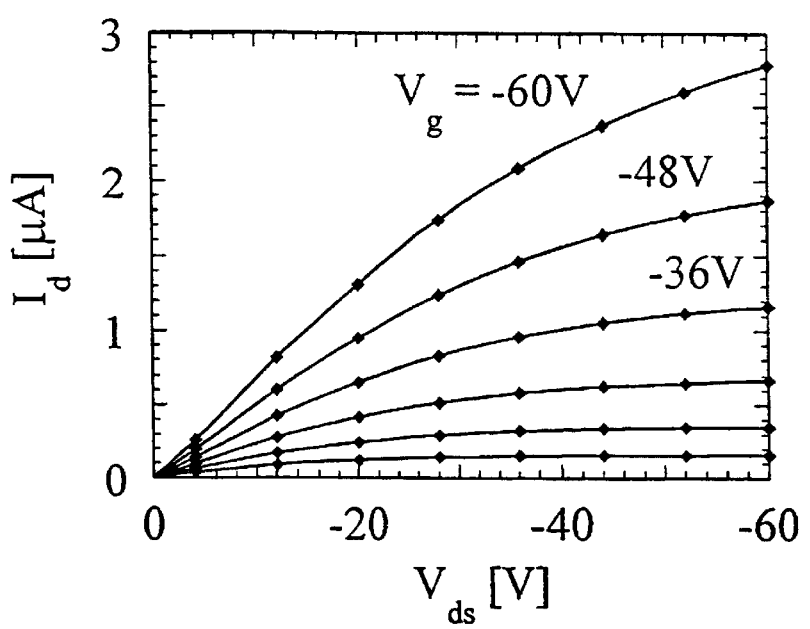

FIG. 5 shows the output characteristics of a top-gate P3HT/PVP TFT fabricated on a standard glass substrate (without the polyimide alignment layer). The device characteristics are comparable to that of devices fabricated in the same deposition run on conventional TFT substrates with bottom-gate $SiO_2$ insulators. The mobility extracted from the transfer characteristics in the saturation regime is on the order of 0.01–0.02 $cm^2$Vs. The OFF-conductivity of the device is somewhat higher than that of the corresponding bottom-gate devices which is believed to be due to doping of the surface of the P3HT surface by residual oxygen. This is not related to the specific device structure and could be solved by exposing P3HT to a reductive dedoping treatment in hydrazine prior to the deposition of PVP (H. Sirringhaus, et al., Science 280, 1741 (1998)).

Devices were also fabricated with F8T2 as the semiconducting polymer. On a plain glass substrate, that is without an alignment layer, both the mobility of 0.003–0.005 $cm^2$Ns and the ON-OFF current ratio are comparable to those of bottom-gate transistors fabricated on $SiO_2$.

These results demonstrate clearly that it is possible to fabricate abrupt interfaces between two solution-processed polymer layers and maintain the high degree of interfacial order which is required to obtain high charge carrier mobilities of >$10^{-3}$–$10^{-2}$ cm/Vs in the accumulation layer of a TFT.

Figure 6:
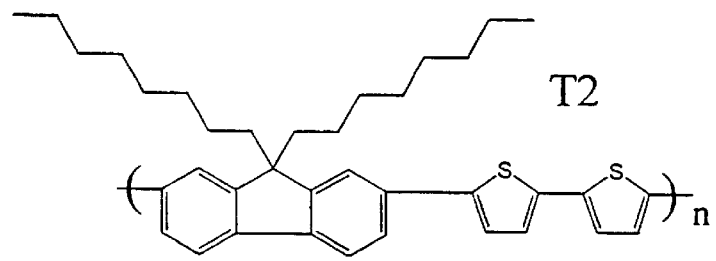
FIG. 6 shows output characteristics (a) and transfer characteristics (b) of an aligned top-gate T2/PVP TFT (L=210 µm, channel width W=1.5 mm)
Figure 6:
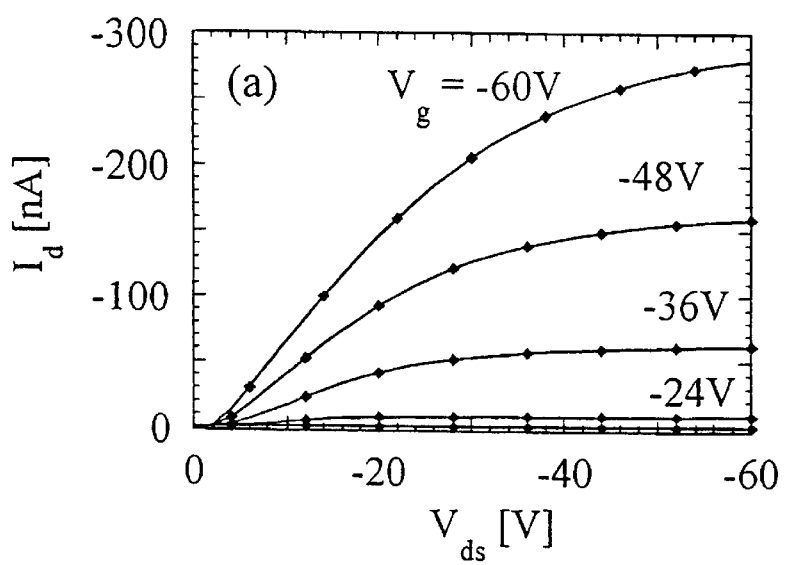
Figure 6:
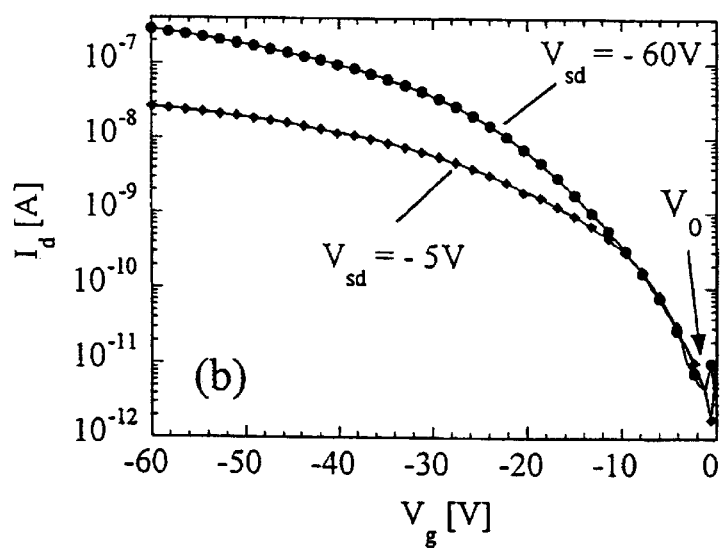
Figure 7:
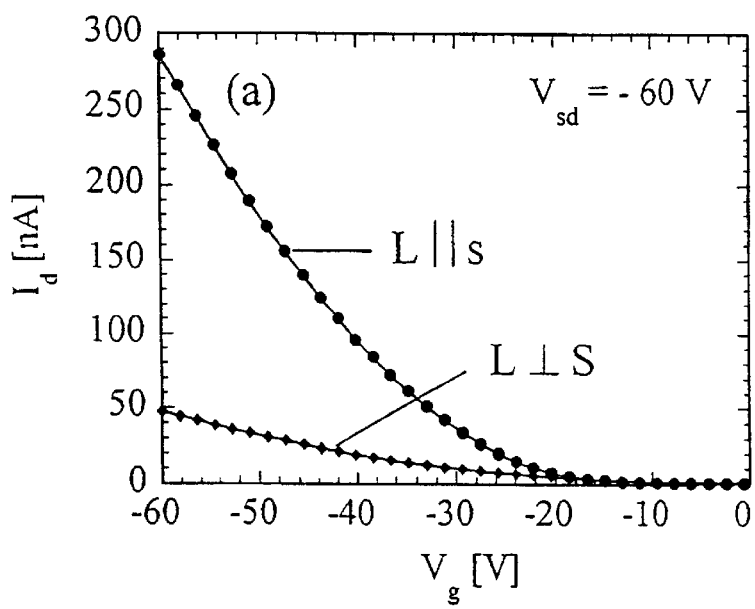
FIG. 7 shows saturated (a) and linear (b) transfer characteristics of T2/PVP TFTs with channels oriented parallel and normal to the rubbing direction (L=210 µm, W=1.5 mm)
Figure 7:
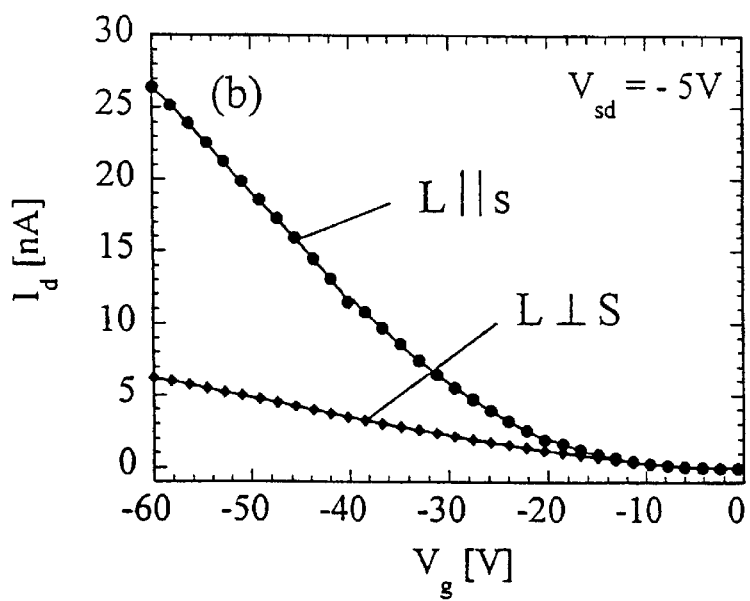

The procedure to deposit a polymeric gate insulator from a polar solvent has been applied to fabricate top-gate TFT devices on top of uniaxially aligned LC polymer films. FIG. 6 shows the output (a) and transfer characteristics (b) of an aligned T2/PVP TFT with the channel oriented parallel to the rubbing direction. The device characteristics show good current saturation and ON-OFF current ratios >$10^4$–$10^5$. FIG. 7 compares the transfer characteristics in the saturation (a) and linear (b) regime of aligned T2/PVP TFT devices with channels parallel and perpendicular to the rubbing direction s. The devices are fabricated on the same substrate. The transistor current is higher by a factor of typically 5–8 if the current flow is along the rubbing direction, that is, along the preferential direction of the polymer backbones. The mobilities extracted from the transfer characteristics are 0.009–0.02 $cm^2$/Vs for transport parallel to the direction of preferential alignment of the polymer chains and 0.001–0.002 $cm^2$/Vs for the perpendicular direction.

These mobility values can be compared to those of isotropic TFT devices, that underwent the same thermal treatment as the uniaxially aligned devices, but exhibit no monodomain alignment. These isotropic, multidomain devices (x) are prepared on areas of the substrate that are not coated by polyimide, and typically exhibit mobilities $\mu_x$=0.003–0.005 $cm^2$/Vs with $\mu_\perp < \mu_x < \mu_\parallel$.

This demonstrates that uniaxial alignment results in a significant improvement of the mobility by typically a factor of 3 compared to isotropic devices. However, even the isotropic devices exhibit significantly higher mobilities and better turn-on voltage stability than devices in which the F8T2 film underwent no thermal treatment ($\mu_{as\text{-}spun}$<$10^{-3}$ $cm^2$/Vs). In the multidomain, isotropic devices the domain sizes are on the order of 0.1–1 $\mu$m, as estimated from optical micrographs, that is, the TFT channel contains several LC domain boundaries. This indicates that LC domain boundaries in the nematic glass do not act as carrier traps to the same extent as microcrystalline grain boundaries in as-spun films.

The observation of a significant mobility anisotropy shows that with the device configuration demonstrated here it is possible to exploit fast intrachain transport along the polymer chain using conjugated polymers that form LC phases and can be aligned by using alignment layers. Further optimisation of the alignment process, which will include optimisation of the annealing and rubbing procedure and treatment of the aligned films with solvent vapours is likely to result in a further increase of the dichroic ratio in the channel region and higher mobilities.

Other LC polymers may be used as well. Higher mobilities are expected in materials that show stronger interchain interactions, and facilitate interchain hopping of charge carriers between adjacent polymer chains. The most desirable orientation to obtain high mobilities would be a structure in which the direction of $\pi$—$\pi$ stacking was preferentially oriented in the plane of the film perpendicular to the rubbing direction. This would require a biaxial liquid crystalline polymer showing an anisotropy and preferred orientation of the molecules in a plane normal to the alignment direction of the polymer backbone (A. M. Donald, A. H. Windle, Liquid Crystalline Polymers, Cambridge Solid State Science Series, ed. R. W. Cahn, E. A. Davis, I. M. Ward, Cambridge University Press, Cambridge, UK (1992)).

LC polymers that yield a higher degree of alignment and longer persistence length along the polymer chain (M. Grell et al., Macromolecules 32, 5810 (1999)) are also expected to yield higher mobilities.

In order to allow for efficient hole injection from the source-drain electrodes the LC polymer should have a sufficiently low ionisation potential, preferably below 5.5 eV, that is well matched to the work function of common source-drain electrode materials such as inorganic metal electrodes (gold, platinum, aluminium, etc.) or conducting polymers such as PEDOT.

Figure 8:
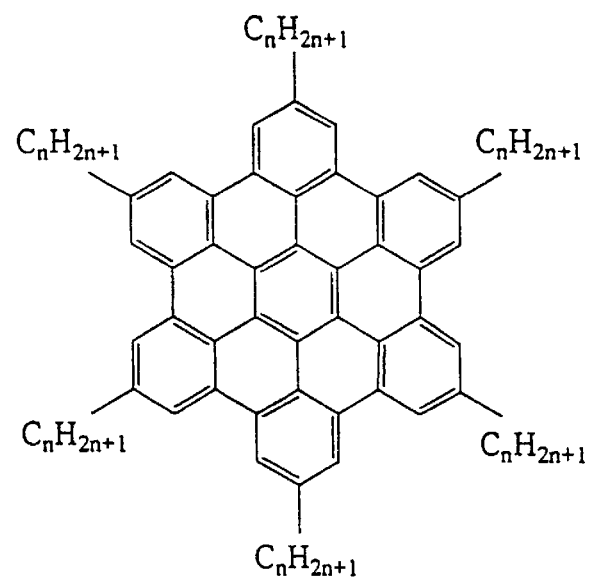
FIG. 8 shows the structure of the discotic liquid crystal molecule hexabenzocoronene (HBC) and the desired orientation of the discotic columns on the alignment layer with respect to the direction of in-plane FET charge transport.
Figure 8:
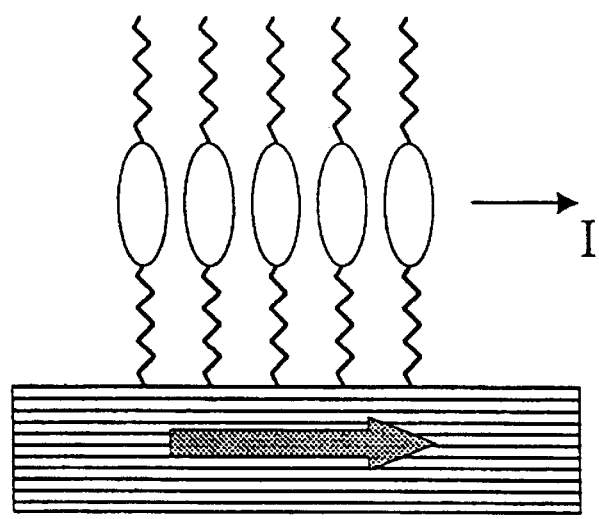

Other types of LC molecules to which this TFT fabrication process is applicable are disc-shaped conjugated molecules with flexible side chains forming discotic mesophases. Along the 1 D columnar stacks high charge carrier mobilities can be obtained (D. Adam, et al. Nature 371, 141 (1994)). In some discotic molecules such as hexabenzocoronenes (HBC)) (P. Herwig, et al., Adv. Mater. 8, 510 (1996)) the columns tend to be oriented in the plane of the film such that the high mobilities along the columns could be exploited in in-plane transistor transport (FIG. 8). HBC has a low solubility in polar solvents as well. Techniques to align discotic molecules with the use of alignment layers have been developed (Mori, Hiroyuki, European patent application 94116645.6; Kamada, et al., European patent application 94114956.9).

Figure 9:
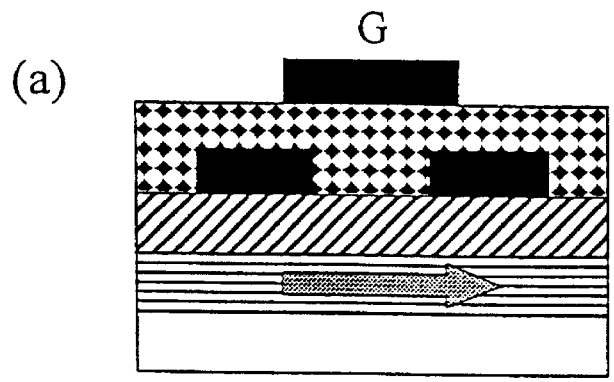
FIG. 9 shows alternative configurations for aligned polymer TFTs.
Figure 9:
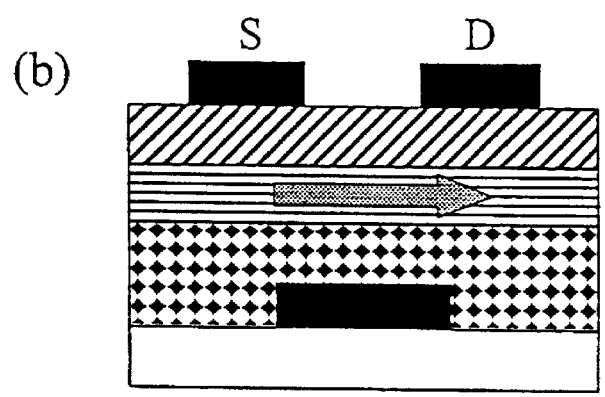
Figure 9:
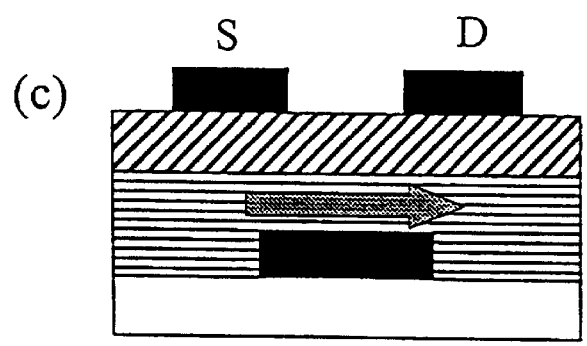

Several modifications of the device configuration are possible. The source/drain electrodes may be deposited after deposition/and alignment of the LC polymer (FIG. 9a). This will facilitate charge carrier injection at the source-drain electrodes, and improve the alignment of the polymer in the vicinity of the electrodes. The alignment layer may be used as the gate insulator itself in a conventional bottom gate configuration either in a single-layer (FIG. 9c) or double-layer configuration (FIG. 9b). In the latter the second insulating layer provides additional dielectric strength. The bottom gate structure may be less suitable for alignment layers produced by mechanical rubbing due to defects at the active interface, but it is believed to be suitable for other alignment techniques such as photoalignment.

Applications of polymer TFTs according to this invention are in polymer TFT logic circuits (C. Drury, et al., APL 73, 108 (1998)) or as pixel drive transistors in high-resolution, active matrix displays (H. Sirringhaus, et al., Science 280, 1741 (1998)). Examples of such displays are active matrix polymer LED displays, liquid-crystal displays (LCD) or electrophoretic displays. The enhanced charge carrier mobility along the direction of preferential uniaxial alignment of the polymer chains compared to the mobility of the isotropic polymer film can be used to increase the operation speed and the drive current capability of the TFTs.

Some preferred aspects of selection of semiconducting polymers for use as described above will now be described.

The polymer should preferably be able to form monodomains on the alignment layer at temperatures below 300° C., most preferably below 200/150° C. To be able to inject charge carriers and to obtain stable TFT characteristics the ionisation potential of the material should preferably be below 5.8 eV, preferably below 5.5 eV, most preferably below 5.1 eV.

The polymer needs preferably to have good stability against chemical reaction with the atmosphere (oxygen, water) etc during the high temperature annealing step. The polymer should have an ionisation potential larger than 4.9 eV, preferably higher than 5.1 eV. The TFT should have a ON-OFF current switching ratio larger than 10^3, most preferably larger than 10^4, and a turn-on gate voltage V0 less than −30V, most preferably less than −10V.

A preferred class of materials to achieve good environmental stability and high mobility are A-B rigid-rod block-copolymers containing a regular ordered sequence of A and B blocks. Suitable A blocks are structurally well defined, ladder type moieties with a high band gap (e.g. greater than 2.5 eV), that have high ionisation potentials larger than 5.5 eV as a homopolymer and good environmental stability. These features are preferable independently and in combination. Examples of suitable A blocks are fluorene derivatives (for example those disclosed in U.S. Pat. No. 5,777,070), indenofluorene derivatives, or phenylene or ladder-type phenylene derivatives (for example those disclosed in J. Grimme et al., Adv. Mat. 7, 292 (1995)). Suitable B blocks are hole-transporting moieties with lower bandgaps (for example less than 2.5 eV) that contain heteroatoms such as sulphur or nitrogen, and as a homopolymer have ionisation potentials less than 5.5 eV. These features are preferable independently and in combination. Examples of hole-transporting B blocks are thiophene derivatives, or triarylamine derivatives. The effect of the B block is to lower the ionisation potential of the block copolymer. The ionisation potential of the block copolymer is preferably in the range of 4.9 eV$\leq I_p \leq$5.5 eV. Examples of such copolymers are F8T2 (ionisation potential 5.5 eV) or TFB (U.S. Pat. No. 5,777,070).

Instead of hole transporting semiconducting polymers soluble electron transporting materials may be used as well. These require a high electron affinity larger than 3 eV, preferably larger than 3.5 eV, to prevent residual atmospheric impurities such as oxygen to act as carrier traps. AB-type block copolymers with a structurally-well defined, ladder-type A block with a high ionisation potential larger than 5.5 eV and an electron-transporting B block that increases the electron affinity of the copolymer to a value higher than 3 eV, preferably higher than 3.5 eV are preferred. Examples of A blocks are fluorene derivatives (for example those disclosed in U.S. Pat. No. 5,777,070), indenofluorene derivatives, phenylene or ladder-type phenylene derivatives (for example those disclosed in J. Grimme et al., Adv. Mat. 7, 292 (1995)). Examples of electron-transporting B blocks are benzothiadiazole derivatives (for example those disclosed in U.S. Pat. No. 5,777,070), perylene derivatives, naphtalenetetracarboxylic diimide derivatives or fluorinated thiophene derivatives.

Many of these block copolymers exhibit liquid-crystalline phases at elevated temperatures (F8, F8T2), whereas others such as TFB do not form LC phases. With TFB field-effect mobilities of 0.002 cm$^2$/Vs have been obtained in the top-gate device configuration. In the case of TFB an annealing step at a temperature of 200–290° C., i.e., above the glass transition temperature, followed by rapid quenching has been found to enhance the mobility and threshold voltage stability. Although in the case of TFB no LC transition could be detected, this improvement of top-gate TFB devices is attributed to a reduction of charge trapping at structural defects such as crystalline domain boundaries when the polymer is prepared in an amorphous glassy state.

In general, polyfluorene-based block-copolymers are a promising new class of conjugated polymers that have not hitherto been used in polymer transistor devices. For the reasons indicated above, polyfluorene-based block copolymers are one preferred class of materials for aligned semiconductor layers of devices described above.

The present invention may include any feature or combination of features disclosed herein either implicitly or explicitly or any generalisation thereof, irrespective of whether it relates to the presently claimed invention. In view of the foregoing description it will be evident to a person skilled in the art that various modifications may be made within the scope of the invention.

What is claimed is:

1. A method for forming an electronic device having a first electrode, a second electrode and a semiconducting active layer comprising a polymer, the method comprising aligning the chains of the polymer in a plane by bringing the polymer into a liquid-crystalline phase, the first electrode and the second electrode being disposed such that when a voltage is applied across the first and second electrodes the direction of current flow between the electrodes is in the plane.

2. A method as claimed in claim 1, wherein the device is a transistor.

3. A method as claimed in claim 1, wherein the liquid-crystalline phase is a nematic or smectic phase.

4. A method as claimed in claim 1 wherein the step of bringing the polymer into the liquid-crystalline phase comprises heating the polymer.

5. A method as claimed in claim 4, comprising the step of quenching the polymer subsequent to the said heating.

6. A method as claimed in claim 5, wherein the said quenching step is such as to form the polymer into an amorphous glassy state.

7. A method as claimed in claim 1, wherein the chains of the polymer are aligned in the said direction of current flow.

8. A method as claimed in claim 1, comprising depositing the polymer on top of an alignment layer capable of inducing the said alignment of the polymer.

9. A method as claimed in claim 1, comprising the step of forming the alignment layer by mechanical rubbing of a substrate.

10. A method as claimed in claim 1, wherein the polymer is a semiconducting polymer.

11. A method as claimed in claim 1, wherein the polymer is a hairy-rod liquid-crystalline polymer.

12. A method as claimed in claim 1, wherein the polymer is a rigid rod liquid-crystalline polymer.

13. A method as claimed in claim 1, wherein the polymer is a conjugated polymer.

14. A method as claimed in claim 1, wherein the semiconducting polymer is a polyfluorene homo-polymer or a polyfluorene based co-polymer.

15. A method as claimed in claim 1, wherein the semiconducting polymer is a polyfluorene homo-polymer or a polyfluroene based block copolymer.

16. A method as claimed in claim 1, wherein the semiconducting polymer is F8 or F8T2.

17. A method as claimed in claim 1, comprising the step of depositing the semiconducting polymer from solution.

18. A method as claimed in claim 1, comprising the step of forming an active interface of the transistor by solution deposition of a second polymer layer on top of a solution-processed polymer layer that has not been converted into an insoluble form prior to the deposition of the second polymer layer.

19. A method as claimed in claim 18, wherein the second layer forms a gate insulator of the transistor.

20. A method as claimed in claim 18, wherein the second layer comprises PVP.

21. A method as claimed in claim 18, wherein the said semiconductive active layer is the said solution-processed polymer layer.

22. A method as claimed in claim 18, wherein the said solution-processed polymer layer is soluble in a non-polar organic solvent, but is insoluble in a polar solvent.

23. A method as claimed in claim 22, wherein the second polymer layer is deposited from a polar organic solvent, in which the said solution-processed polymer layer is not soluble.

24. A method as claimed in claim 18, wherein the solution deposition of the second polymer layer is performed after the said alignment step.

25. A method as claimed in claim 1, wherein the polymer chains are arranged in uniaxial alignment.

26. A method as claimed in claim 1, wherein the polymer chains are arranged in uniaxial, monodomain alignment.

27. A method as claimed in claim 1, wherein the polymer chains are aligned in domains of local parallel alignment.

28. An electronic device formed by the method of claim 1.

29. A logic circuit comprising a transistor as claimed in claim 28.

30. A logic circuit as claimed in claim 29 including at least one optical device.

31. An active matrix display comprising a transistor as claimed in claim 28.

32. An electronic device having a first electrode, a second electrode and a semiconducting active layer in which the polymer chains have been aligned in a plane by bringing the polymer into a liquid-crystalline phase, the first electrode and the second electrode being disposed such that when a voltage is applied across the first and second electrodes the direction of current flow between the electrodes is in the plane.

33. An electronic device wherein the semiconductor layer comprises a block co-polymer having a first block of conjugated monomer units each linked by at least two covalent bonds, and a second block of monomer units different from those of the first block, the block co-polymer having an electron affinity greater than 3.0 eV or 3.5 eV.

34. An electronic device wherein the semiconductive layer comprises a block co-polymer comprising a first block of conjugated monomer units each linked by at least two covalent bonds, and a second block of monomer units different from those of the first block, the block co-polymer having an ionisation potential in the range from 5.5 eV to 4.9 eV.

35. An electronic device as claimed in claim 33 or 34, herein the first block of monomer units comprises one or more of the group comprising a fluorine derivative, a ladder-type phenylene derivative and an indenofluorene derivative and the second block of monomer units comprises one or more of the group comprising a thiophene derivative, a triarylamine derivative and a benzothiadiazole derivative.

36. An electronic device as claimed in claim 33, wherein the semiconducting layer comprises F8, F8T2 or TFB.

37. An electronic device as claimed in claim 33 in which the chains of the semiconductor layer have been aligned parallel to each other by bringing the polymer into a liquid-crystalline phase.

38. An electronic device as claimed in claim 33 in which the semiconductor layer has been prepared in a glassy state by quenching from a temperature above its glass transition temperature.

39. An electronic device as claimed in claim 38, in which the semiconductor layer has been prepared in a glassy state by quenching from a temperature above its glass transition temperature to ambient temperature.

40. An electronic device as claimed in claim 39, in which the semiconductor layer has been prepared in a glassy state by quenching from a temperature above its glass transition temperature to room temperature.

41. A polymer transistor as claimed in claim 32.

42. An electronic device as claimed in claim 32, wherein the device is a transistor.

43. An electronic device as claimed in claim 42, wherein the device is a thin-film transistor.

44. An electronic device as claimed in claim 42, wherein the channel of the transistor is oriented substantially parallel to the direction of the aligned polymer chains.

45. An electronic device as claimed in claim 32, comprising an alignment layer directly underlying the active layer.

46. An electronic device as claimed in claim 32, wherein the polymer is a semiconducting polymer.

47. An electronic device as claimed in claim 32, wherein the polymer is in an amorphous glassy state.

48. A method for forming an electronic device having a semiconducting active layer comprising a polymer, the method comprising aligning the chains of the polymer within domains by bringing the polymer into a liquid-crystalline phase.

49. A method for forming an electronic device having a semiconducting active layer comprising a polymer, the method comprising aligning the chains of the polymer as a monodomain oriented in a preferred uniaxial direction within the layer of the electronic device by bringing it into a liquid-crystalline phase.

* * * * *